United States Patent
Petersen et al.

(10) Patent No.: US 8,310,258 B2
(45) Date of Patent: Nov. 13, 2012

(54) PROBE FOR TESTING ELECTRICAL PROPERTIES OF A TEST SAMPLE

(75) Inventors: Dirch Petersen, Lyngby (DK); Torben Mikael Hansen, Copenhagen Ø (DK); Peter R. E. Petersen, Hillrød (DK)

(73) Assignee: Capres A/S, Lyngby (DK)

( * ) Notice: Subject to any disclaimer, the term of this patent is extended or adjusted under 35 U.S.C. 154(b) by 71 days.

(21) Appl. No.: 12/091,927

(22) PCT Filed: Oct. 31, 2006

(86) PCT No.: PCT/DK2006/000603
§ 371 (c)(1),
(2), (4) Date: Aug. 12, 2008

(87) PCT Pub. No.: WO2007/051471
PCT Pub. Date: May 10, 2007

(65) Prior Publication Data
US 2009/0219047 A1    Sep. 3, 2009

(30) Foreign Application Priority Data
Oct. 31, 2005  (EP) .................................... 05388093

(51) Int. Cl.
*G01R 31/00* (2006.01)
(52) U.S. Cl. ......... 324/755.07; 324/755.05; 324/754.11; 324/754.03; 324/755.01
(58) Field of Classification Search .................. 324/754, 324/158.1, 762, 754.11, 755.07
See application file for complete search history.

(56) References Cited

U.S. PATENT DOCUMENTS

| | | | |
|---|---|---|---|
| 3,702,439 A * | 11/1972 | McGahey et al. ........ | 324/754.03 |
| 4,383,217 A | 5/1983 | Shiell | |
| 4,703,252 A | 10/1987 | Perloff et al. | |
| 5,691,648 A | 11/1997 | Cheng | |
| 6,255,585 B1 * | 7/2001 | Jones et al. .................... | 174/541 |
| 6,507,204 B1 * | 1/2003 | Kanamaru et al. ........ | 324/755.07 |
| 6,636,063 B2 * | 10/2003 | Arnold et al. ................. | 324/762 |
| 6,672,875 B1 | 1/2004 | Mathieu et al. | |
| 6,747,445 B2 | 6/2004 | Fetterman et al. | |
| 6,747,465 B2 * | 6/2004 | Esashi et al. .................. | 324/754 |
| 6,771,084 B2 * | 8/2004 | Di Stefano ............... | 324/755.07 |
| 6,788,080 B1 * | 9/2004 | Lenz ............................. | 324/754 |
| 6,828,804 B2 * | 12/2004 | Yashiro et al. ................ | 324/678 |
| 6,922,069 B2 * | 7/2005 | Jun .......................... | 324/755.07 |
| 6,943,571 B2 | 9/2005 | Worledge | |
| 7,091,729 B2 * | 8/2006 | Kister ....................... | 324/755.07 |
| 7,377,788 B2 * | 5/2008 | Hasegawa ....................... | 439/66 |

(Continued)

FOREIGN PATENT DOCUMENTS

EP    1 085 327    3/2001
(Continued)

*Primary Examiner* — Richard Isla Rodas
(74) *Attorney, Agent, or Firm* — Klein, O'Neill & Singh, LLP

(57) ABSTRACT

A probe for testing electrical properties of test samples includes a body having a probe arm defining proximal and distal ends, the probe arm extending from the body at the proximal end of the probe arm, whereby a first axis is defined by the proximal and the distal ends. The probe arm defines a geometry allowing flexible movement of the probe arm along the first axis and along a second axis perpendicular to the first axis, and along a third axis orthogonal to a plane defined by the first axis and the second axis.

12 Claims, 6 Drawing Sheets

U.S. PATENT DOCUMENTS

| | | |
|---|---|---|
| 7,504,822 B2 * | 3/2009 | Parrish et al. ............ 324/756.03 |
| 7,557,593 B2 * | 7/2009 | Hirakawa et al. ............. 324/754 |
| 7,659,739 B2 * | 2/2010 | Kister ............................ 324/761 |
| 2001/0012739 A1 | 8/2001 | Grube et al. |
| 2002/0153911 A1 * | 10/2002 | Cho et al. ...................... 324/754 |
| 2003/0102878 A1 | 6/2003 | Montoya |
| 2003/0151419 A1 * | 8/2003 | Felici et al. ................... 324/754 |
| 2004/0036490 A1 * | 2/2004 | Schaeffer et al. ............. 324/754 |
| 2004/0072452 A1 | 4/2004 | Eldridge et al. |
| 2005/0062448 A1 | 3/2005 | Oh et al. |
| 2005/0081609 A1 | 4/2005 | Worledge |
| 2005/0110507 A1 * | 5/2005 | Koizumi et al. .............. 324/754 |
| 2005/0151552 A1 | 7/2005 | Abraham et al. |
| 2008/0106280 A1 * | 5/2008 | Chen et al. .................... 324/754 |
| 2008/0197866 A1 * | 8/2008 | Jo .................................. 324/754 |

FOREIGN PATENT DOCUMENTS

| | | |
|---|---|---|
| JP | 55133550 | 10/1980 |
| JP | 6249880 | 9/1994 |
| JP | 2005291725 | 10/2005 |

* cited by examiner

Illustrations of the same graph from two different angles

Boundary plane for a minimum friction coefficient µ = 0.2 as function of cantilever dimensions.
The solid line is the zero lateral force criteria.
(theta = pi/4, phi = pi/6)

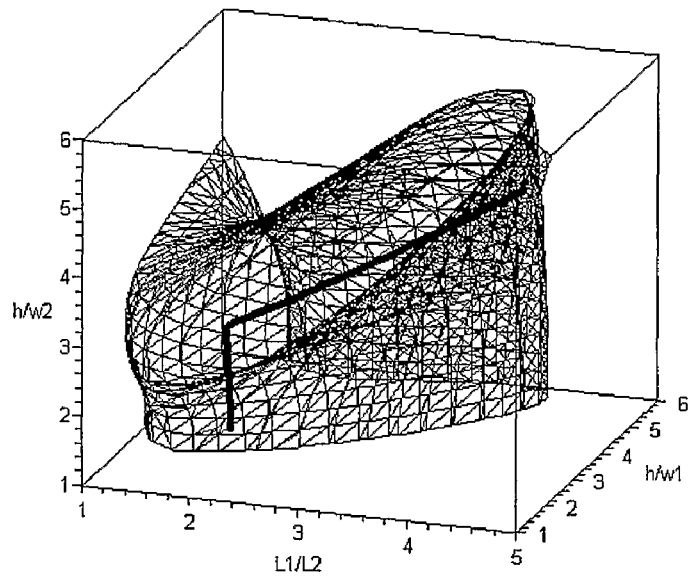

Fig. 16

Boundary plane for a minimum friction coefficient µ = 0.2 as function of cantilever dimensions.
The solid line is the zero lateral force criteria.
(theta = pi/4, phi = pi/6)

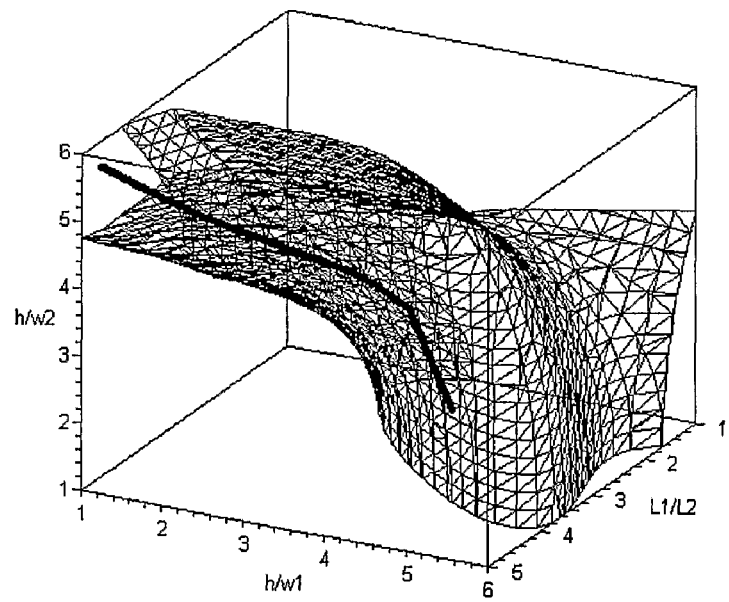

Fig. 17

SEM micrograph of a micro four point probe with L-shaped cantilevers.

PROBE FOR TESTING ELECTRICAL PROPERTIES OF A TEST SAMPLE

CROSS-REFERENCE TO RELATED APPLICATION

This application is a national phase filing, under 35 U.S.C. §371(c), of International Application No. PCT/DK2006/000603, filed Oct. 31, 2006, the disclosure of which is incorporated herein by reference in its entirety.

FEDERALLY SPONSORED RESEARCH OR DEVELOPMENT

Not Applicable

BACKGROUND OF THE INVENTION

The present invention relates to a probe for testing electrical properties of test samples.

When performing resistance measurements for determining electrical properties of a test sample, a test probe comprising one or more arms each carrying a tip for establishing electrical contact to the test surface is brought into contact with the test surface.

The present invention provides a cantilever (beam) geometry that enables a non-penetrating static contact to be formed between a cantilever tip and a test sample surface. Further, the present invention provides a multi-cantilever probe with one or more cantilevers defined by the cantilever (beam) geometry. Still further the present invention provides a methodology for designing nanoelectromechanical systems (NEMS) and microelectromechanical systems (MEMS) for which a low wear static contact is desired to improve stability and lifetime of a mechanical contact or an electromechanical contact.

Microscopic four point probes are used as metrology tool for electrical characterisation of conductive and semi-conductive thin films and multi-layered structures. As illustrated in FIG. 1 it has been observed that mechanical movement (sliding and vibrations) in the contact between a surface and the tip of a straight cantilever causes wear of the cantilever tip. To reduce this mechanical wear and to reduce the tip penetration into a sample surface, a flexible cantilever has been designed to obtain a non-penetrating static mechanical contact upon surface contact.

Related systems and methods may be found in publications such as US 2004/072452, US 2003/102878, WO 2005/031376, U.S. Pat. No. 6,672,875, US 2001/012739, U.S. Pat. No. 4,383,217, EP 1 085 327, US 2004/183554, U.S. Pat. Nos. 6,943,571, 4,703,252, 5,691,648, 6,747,445, US 2005/0151552, US 2005/0081609 and US 2005/0062448. Reference is made to all of the above-mentioned US patent publications, all of which are hereby incorporated in the present specification by reference in their entirety for all purposes.

SUMMARY OF THE INVENTION

A first aspect of the present invention relates to a test probe formed so as to, at least partly, reduce the wear of the test probe during performing tests. The test probe comprises:

a body having a probe arm defining a proximal end and an opposite distal end, the probe arm extending from the body at the proximal end of the probe arm, a first axis being defined by the proximal end and the distal end, the probe arm defining a geometry allowing flexible movement of the probe arm along the first axis and along a second axis perpendicular to the first axis and along a third axis orthogonal to a plane defined by the first axis and second axis.

The geometry defined by the probe arm provides the probe arm with flexible motion so that when the probe is in contact with a test sample, and the test probe is held in a holder of a test apparatus, vibrations from the surroundings are at least to a certain degree absorbed in the arm and not transferred to motion between the probe arm and test sample. This static contact between the test probe and the test sample may be achieved by ensuring that the frictional force is higher that the absolute force applied in the surface plane of the test sample.

The probe arm extends freely from the body. The probe arms have free, flexible motion.

The body defines a first planar surface. The arm extends from the body. The arm defines a plane being parallel to the first planar surface of the body. The first planar surface and the plane defined by the arm are parallel when the arm is not in contact with a surface of a test sample. The arm may define an L-shaped geometry or any other geometry giving flexibility to the arm so that a static contact may be achieved.

In one embodiment, the arm may be formed by depositing material on the body. E.g. by starting out with a larger structure whereon the arm is formed by deposition, then part of the material supporting the arm in this stage is removed so that the arm may freely extend from the body. The body is then the remaining part of the larger structure.

When the probe is held in static contact with the test sample rather than the test probe moving relative to the test sample, significant increase in the lifetime of the test probe is achieved. Also, it is contemplated that the quality of tests performed is increased as the conditions under which the test is performed are not changed and the contact area of the test sample remains substantially the same.

When the probe is held in static contact with a surface part of the test sample, a common approximation of the friction force, $F_f$, is given by the product of the static friction coefficient, $\mu_s$, and the normal force, N.

$$F_f = \mu_s N$$

Ideally the lateral force, $F_L$, should be zero, but this is virtually impossible. Thus, in order to obtain a static contact, the friction force must be higher than the lateral force acting in the surface plane.

$$F_f > F_L$$

The lateral force, $F_L$, acting on the cantilever tip is for small movements assumed to be proportional to the normal force.

In an advantageous embodiment of the present invention, the probe arm may be a supporting structure supporting a contact probe for establishing electrical contact to the test sample, a pad for establishing electrical contact to a test apparatus and an electrical conductive strip positioned on or in the body for establishing electrical contact between the contact probe and the pad.

The above mentioned arrangement is provided for the probe to send and receive electrical signals transmitted to and through the test sample, respectively. The electrical signals may be AC, DC, RF, or any other electrical signal or combinations of signals. Also, the test apparatus may include signal filters, lock-in circuits etc.

In some embodiments of the present invention, the geometry may include a semi-circular part and/or a square part and/or a rectangular part and/or triangular part and/or any combinations thereof. The different geometries, or parts thereof, help allowing flexible movement of the probe arm when the probe is subjected to vibrations and/or drift etc.

In a specific embodiment, the geometry may include two substantially linear parts connected so as to define an angle. Further, the probe arm itself may extend from the body in an angle. The angle or angles may be between 0 and 180 degrees, such as between 55 and 145, e.g. 90 degrees.

The angles and geometries mentioned above apply to any or all of the three dimensions.

Advantageously, the probe arm defines substantially equal spring constants in the direction of the first, the second and the third axis. It is found to be very advantageous for the probe arm to have spring constants that are equal or substantially equal in the three dimensions.

In a further embodiment, the body may include a plurality of probe arms. The plurality of probe arms allows for multi-point probe measurements, e.g. four-point probe measurements.

In an even further embodiment of the present invention, the plurality of probe arms may define similar geometries or in the alternative at least two different geometries. In some applications it could be contemplated to have probe arms defining substantially identical or similar geometries, e.g. for having a plurality of probe arms located closely together while defining a line at the probe tips.

In a still further embodiment a probe having probe arms defining different geometries in order to have a plurality of probe arms for positioning a multitude of probe tips closely together without defining a line may be used. Other applications may be envisioned.

In an even still further embodiment of the present invention the probe, when in use, may define spring constants that, when projected onto a plane of a surface of the test sample are substantially equal, or define a ratio between 1:1 to 1:20. When the test probe has been brought into contact with the surface of the test sample an angle is defined between the test probe and the test sample surface. The angle may be between 0 and 180 degrees. usually around 30 degrees. The probe arms have or define spring constants as described elsewhere, wherein when these spring constants are projected onto a plane defined by the surface of the test sample, the projected spring constants are preferably substantially equal. However it has been found that the spring constants may also have a ratio between 1:1 to 1:20. such a 1:2 to 1:15, such as 1:3 to 1:10, such as 1:4 to 1:6, such as 1:1 to 1:2. such as 1:2 to 1:3. such as 1:3 to 1:4, such as 1:4 to 1:5, such as 1:5 to 1:8, such as 1:8 to 1:10. such as 1:10 to 1:15, such as 1:15 to 1:20.

A second aspect of the present invention relates to a probe for testing electrical properties of a test sample. the probe may comprise:

a body defining a first planar surface, a probe arm defining first part having a proximal end an opposite distal end. the probe arm extending from the body at the proximal end of the first part. a first axis defined by the proximal and the distal end of the first part, the probe arm extending parallel with the first planar surface, the probe arm defining a geometry allowing flexible movement of the probe arm along the first axis and along a second axis perpendicular to the first axis and along a third axis orthogonal to a plane defined by the first axis and second axis.

When the probe is brought into contact with a surface of a test sample, the arm does not penetrate the surface of the test sample.

The probe is used for obtaining characteristic electrical properties of a test sample. Such characteristic electrical properties may include resistance and conductivity properties.

It is contemplated to be advantageous that the arm may be positioned in co-planar relationship with the first planar surface. Co-planar relationship means that a plane of the arm and a plane of the body are in the same geometric plane. E.g. the arm may be positioned on the first surface, i.e. the body supports the arm at the first surface of the body.

Further, the body may define a second planar surface being substantially orthogonal to the first planar surface, the probe arm extending from the second planar surface.

In a particular advantageous embodiment of the present invention, the arm may define an L-shaped geometry.

The probe according to the first aspect and the probe according to the second aspect are, when in use, placed in an apparatus including a holding device for holding the probe. Further signal generating and signal detecting equipment may be included in the apparatus, or at least connected to the apparatus for transmitting and receiving/detecting signals to/from the test sample via the probe.

A third aspect of the present invention relates to a test probe for testing electrical properties of test samples. The test probe according to the fifth aspect may comprise:

a body comprising an electrical conductive contact for establishing electrical contact to the test sample, the body being flexibly suspended by spring means so as to allow the probe to establish static contact with the surface of the test sample.

The test probe may be suspended e.g. by springs or other structural elements allowing the probe to be suspended in a flexible manner so that static contact may be established between the test probe and the test sample surface.

Further, the test probe according to the first aspect of the present invention may include any of the features mentioned in relation to the second and/or third aspect.

BRIEF DESCRIPTION OF THE DRAWINGS

The present invention is now to be described with reference to the attached schematic illustrations, in which:

FIGS. 16-17 are numerically calculated design criteria for the L-shaped cantilever.

DETAILED DESCRIPTION OF THE INVENTION

Figure 1:
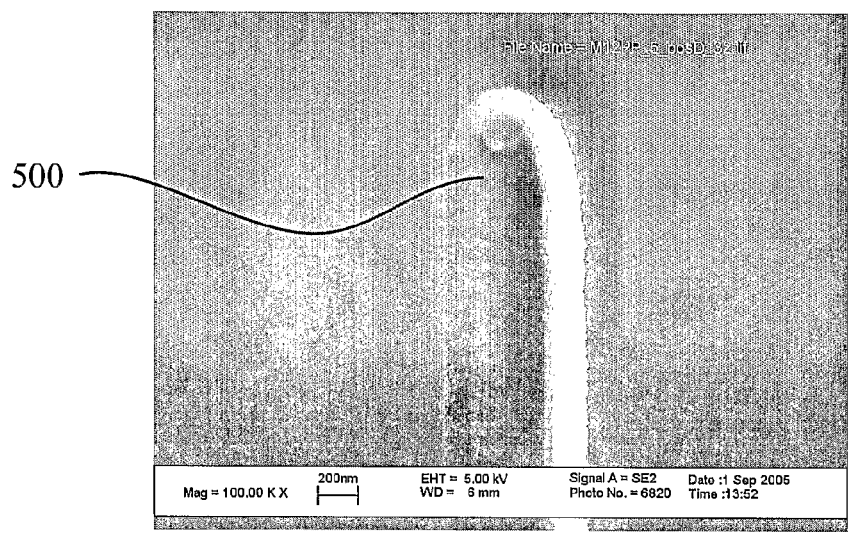
FIG. 1 is a view of a probe tip.

FIG. 1 illustrates the tip 500 of a probe.

In order to increase the lifetime of a probe, the tip wear must be minimised. The wear originates from at least two sources and their individual contributions are unknown. As a straight cantilever is brought into contact with a surface, the tip scrapes along the surface in the longitudinal direction of the cantilever. During measuring, the contact point is believed to be dynamic, i.e. the tip rubs against the surface due to vibrations and drift.

Figure 2:
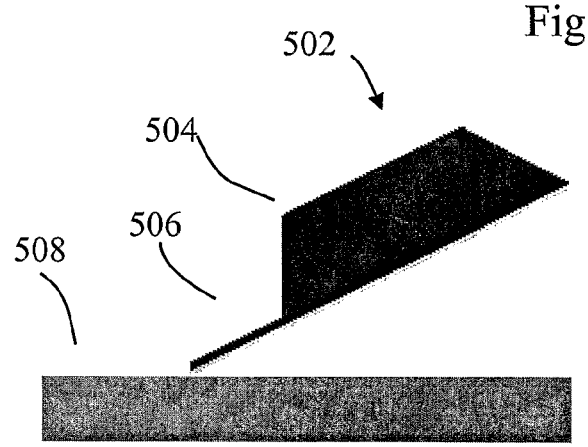
FIG. 2 is a schematic illustration of a probe and a test sample.

FIG. 2 schematically illustrates a probe 502 having a body 504 and a probe arm 506 extending from the body 504. The probe 502 is brought into contact with the surface of a test sample 508. At the end of the probe arm 506, a probe is provided for establishing electrical contact to the surface of the test sample 508 so that tests for determining the electrical properties of the test sample 508 may be performed. When the tip of the probe arm 506 is in contact with the surface of the test sample 508, vibrations and drift in the system holding the test probe 502 and the test sample 508 will cause the tip of the probe 502 to move or scrape along the surface of the test ample 508 causing wear to the tip of the probe 502.

Figure 3:
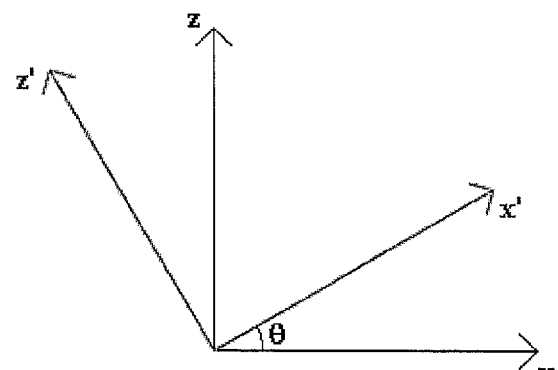
FIG. 3 is a schematic illustration of a co-ordinate system.

A reference co-ordinate system is illustrated in FIG. 3, where the x' and z' axis illustrate the position of the probe and the x and z axis illustrate the position of the test sample. An angle θ is defined between the test sample and the test probe.

In order to reduce this wear a probe according to the present invention is provided in order to create a static contact, both during engaging and during measuring. The cantilevers are given a third dimension of freedom such that each cantilever has a balanced spring constant of $(k_x, k_y, k_z) \sim (k, k, k)$. Unlike conventional micro-four-point probes, vibrations/movements may be absorbed in all directions.

In order to obtain a static contact, the friction force must be higher than the absolute force applied in the surface plane.

$$F_f > |F_x| \quad \text{(I)}$$

The friction force is given by the product of the static friction coefficient and the normal force.

$$F_f = \mu_s \cdot N = -\mu_s \cdot F_s \quad \text{(II)}$$

The forces acting as a result of an engage depth, d, is given by:

$$F_z = F_{x'} \cdot \hat{z} + F_{z'} \cdot \hat{z} = -d \cdot (k_{x'} \sin^2 \theta + k_{z'} \cos^2 \theta) \quad \text{(III)}$$

$$F_x = F_{x'} \cdot \hat{x} - F_{z'} \cdot \hat{x} = -d \cdot (k_{x'} - k_{z'}) \cdot \sin \theta \cdot \cos \theta \quad \text{(IV)}$$

(I), (II), (III) and (IV) reduces to the inequality:

$$\mu_s \cdot \left( A \cdot \tan\theta + \frac{1}{\tan\theta} \right) > |A - 1| \quad \text{(V)}$$

$$A = \frac{k_{x'}}{k_{z'}} \quad \text{(IV)}$$

It is obvious that the inequality is satisfied for A→1. This means that the cantilever spring constants should be equal in absolute value. This can be achieved by a number of different approaches. The formulation can be expanded for 3 dimensions.

FIGS. 4-8 illustrate different embodiments of probe arms contemplated to fulfil the requirements stated above.

Figure 4:
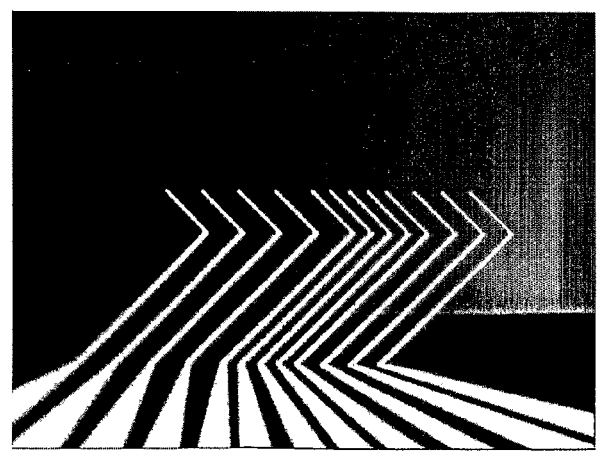
FIG. 4 is an illustration of a probe having a plurality of probe arms.

FIG. 4 illustrates a probe having a plurality of probe arms comprising two substantially straight or linear parts connected at an angle of approximately 90 degrees. The arms extend from a probe body at an angle.

Figure 5:
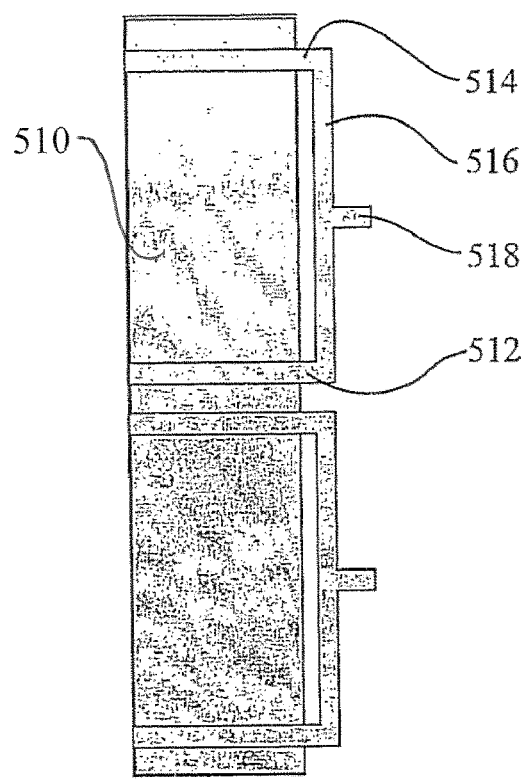
FIGS. 5-7 are different schematic illustrations of a probe having two probe arms.

FIG. 5 schematically illustrates an embodiment of a probe according to the present invention where two probe arms are formed, each having two parts 512 and 514 connected to the body 510, and a part 516 interconnecting the two parts 512, 514. A flexible contact part 518 is provided at the part 516.

The probe arm is preferably formed as an integral part, all of which are considered part of the present invention.

Figure 6:
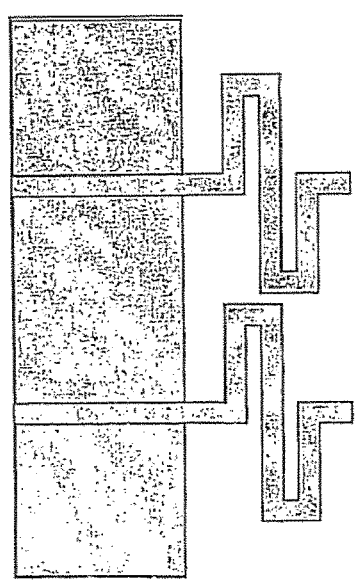

FIG. 6 schematically illustrates an embodiment of a probe according to the present invention where two probe arms are formed each having a structure including a square wave-like geometry. Also embodiments having more than one period of the square wave-like geometry may be envisioned, as well as square wave-like geometries with varying periodicity. All these embodiments are considered part of the present invention.

Figure 7:
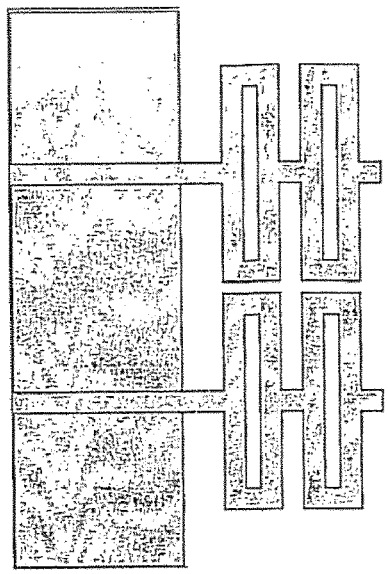

FIG. 7 schematically illustrates an embodiment of a probe according to the present invention where two probe arms are formed each having a structure including two rectangular parts with an aperture formed therein. Embodiments having only one rectangle may be envisioned as well as embodiments having more than two rectangles, both of which are considered part of the present invention.

Figure 8:
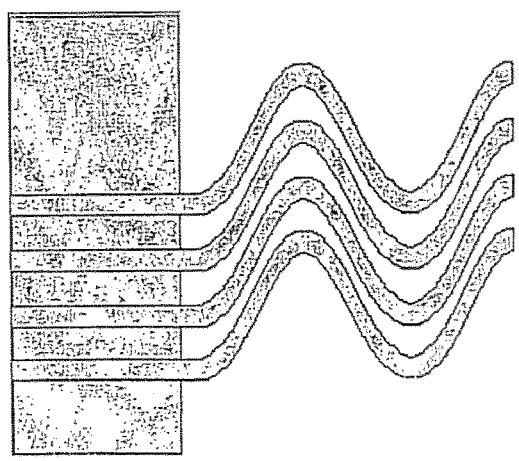
FIG. 8 is a schematic illustration of a probe having four probe arms.

FIG. 8 schematically illustrates an embodiment of a probe according to the present invention where four probe arms are formed each having a structure including a sinusoidal geometry. Embodiments where the sinusoidal geometry has a varying periodicity are considered part of the present invention.

When using probes having the above mentioned and above described geometries the contact between the probe and the test sample remains static and the probe lifetime increases significantly. The same effect may be achieved by similar geometries.

In still further embodiments of the present invention, a probe may be suspended by use of springs, or the like, in order to achieve the same effect as described above in relation to other embodiments of the present invention.

A common approximation of the friction force, $F_f$, is given by the product of the static friction coefficient, $\mu_s$, and the normal force, N.

$$F_f = \mu_s N \quad \text{(I)}$$

Ideally the lateral force, $F_L$, should be zero, but this is virtually impossible. Thus, in order to obtain a static contact, the friction force must be higher than the lateral force acting in the surface plane.

$$F_f > F_L \quad \text{(II)}$$

The lateral force, $F_L$, acting on the cantilever tip is for small movements assumed to be proportional to the normal force.

Figure 9:
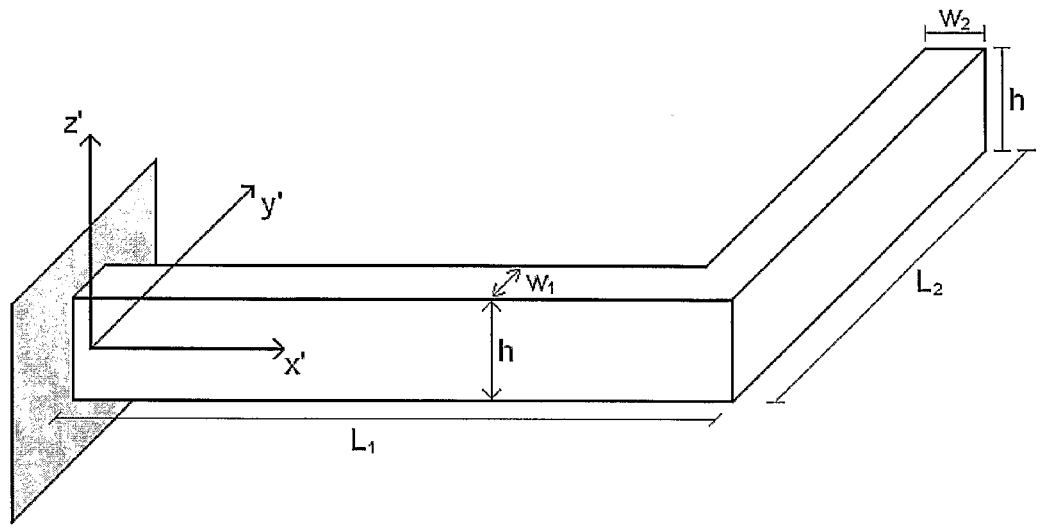
FIG. 9 is a schematic illustration of an L-shaped probe.

One embodiment of the present cantilever design is a high aspect ratio L-shaped cantilever as illustrated in FIG. 9.

FIG. 9 is a schematic illustration of an L-shaped cantilever having two straight beams with rectangular cross section. The two beams intersect at an angle of 90°. The coordinate frame (x',y',z') is defined as the cantilever reference frame.

The cantilever in FIG. 9 is defined relative to a sample in the surface reference frame (x,y,z) which has the same origin as the cantilever reference frame (0,0,0).

The cantilever includes a first part having a first length $L_1$, and a second part having a second length $L_2$. The first part further has a first width $w_1$ and the second part has a second width $w_2$. The first and second parts have substantially equal heights h.

Figures 10, 11:
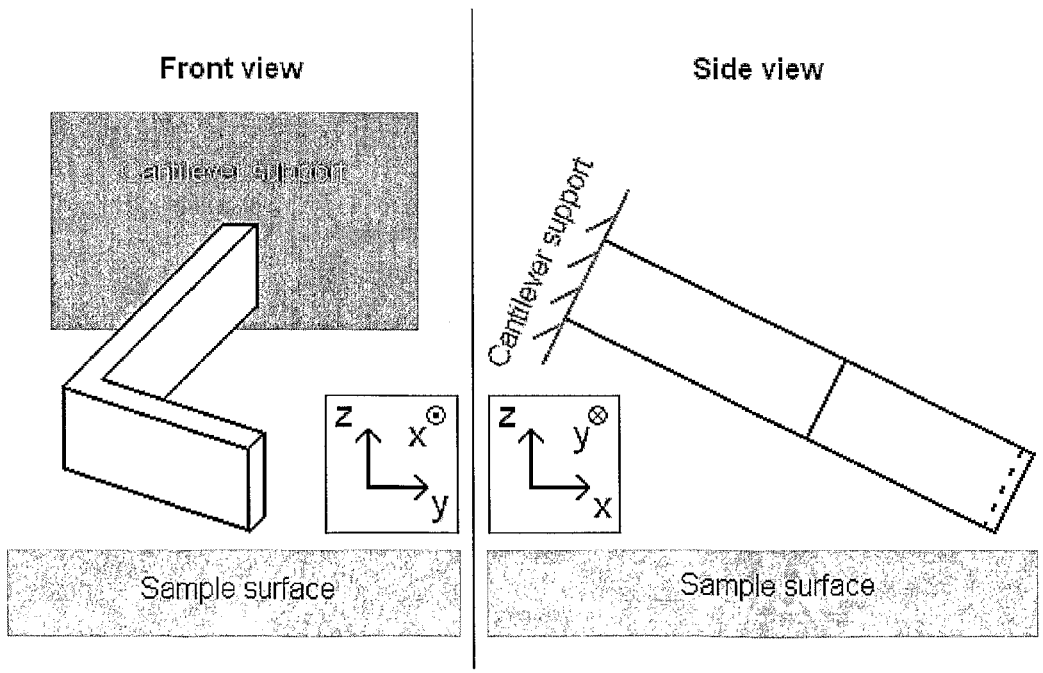
FIG. 10 is a schematic front view of an L-shaped probe.
FIG. 11 is a schematic side view of the L-shaped probe of FIG. 10, FIG. 12 and FIG. 13 are schematic views of co-ordinate systems.

FIGS. 10 and 11 are schematic illustrations of the L-shaped cantilever in the surface reference frame. FIG. 10 is a schematic front view of the cantilever. FIG. 11 is a schematic side view of the cantilever. In FIG. 11 the cantilever is illustrated as extending from a side wall of a cantilever support, however, the cantilever may also be positioned on a top surface of a supporting body, and extend freely from that body.

In the cantilever reference frame the tip deflection $\bar{v}$ can be found as a function of an applied force by Hooke's law.

$$\overline{v} = \overline{C}\overline{F}$$

Applying a force in the $\hat{x}'$ direction will result in a deflection in the $\hat{x}'$ and $\hat{x}'$ direction. And applying a force in the $\hat{y}'$ direction will result in a deflection in the $\hat{y}'$ and $\hat{x}'$ direction. This gives rise to the cross-terms $C_{xy}$ and $C_{yx}$ which can be shown to be equal. Applying a force in the $\hat{z}'$ direction will only result in a deflection in the $\hat{z}'$ direction.

$$\overline{C} = \begin{bmatrix} C_{xx} & C_{xy} & 0 \\ C_{xy} & C_{yy} & 0 \\ 0 & 0 & C_{zz} \end{bmatrix}$$

The spring constant of the cantilever tip, $\overline{K}$, in the beam reference frame is equal to $\overline{C}^{-1}$.

$$\overline{K} = \begin{bmatrix} \dfrac{C_{yy}}{C_{xx}C_{yy} - C_{xy}^2} & \dfrac{C_{xy}}{C_{xx}C_{yy} - C_{xy}^2} & 0 \\ \dfrac{C_{xy}}{C_{xx}C_{yy} - C_{xy}^2} & \dfrac{C_{xx}}{C_{xx}C_{yy} - C_{xy}^2} & 0 \\ 0 & 0 & \dfrac{1}{C_{zz}} \end{bmatrix}$$

The spring constant of the cantilever tip in the surface reference frame is found through rotation.

$$\overline{F} = \overline{R}\overline{K}\overline{R}^{-1}\overline{v}$$

Figure 12:
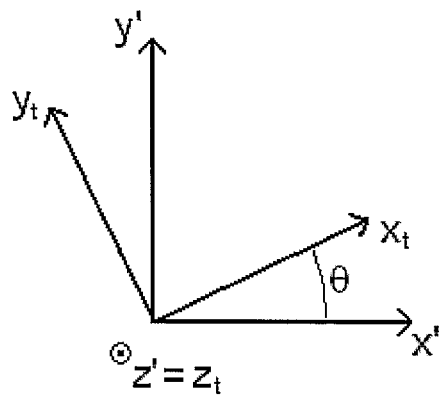
Figure 13:
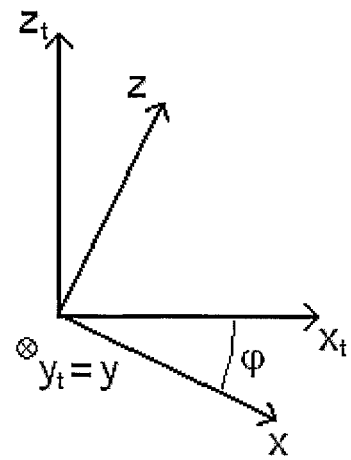

The rotation matrix is found according to FIGS. 12 and 13:

$$\overline{R} = \begin{bmatrix} \cos\theta\cos\varphi & \sin\theta\cos\varphi & \sin\varphi \\ -\sin\varphi & \cos\theta & 0 \\ -\cos\theta\sin\varphi & -\sin\theta\sin\varphi & \cos\varphi \end{bmatrix}$$

FIG. 12 schematically illustrates rotation of the cantilever reference frame around the z'-axis into a temporary reference frame.

FIG. 13 schematically illustrates rotation of the temporary reference frame around the $y_t$-axis into the surface reference frame.

FIGS. 16 and 17 illustrate, according to (II). the numerically calculated design criteria for the L-shaped cantilever where $\theta = 45°$ and $\phi = 30°$ and a minimum static friction coefficient of 0.2 is estimated. FIGS. 16 and 17 are identical but seen from different angles.

Figures 18, 19, 20:
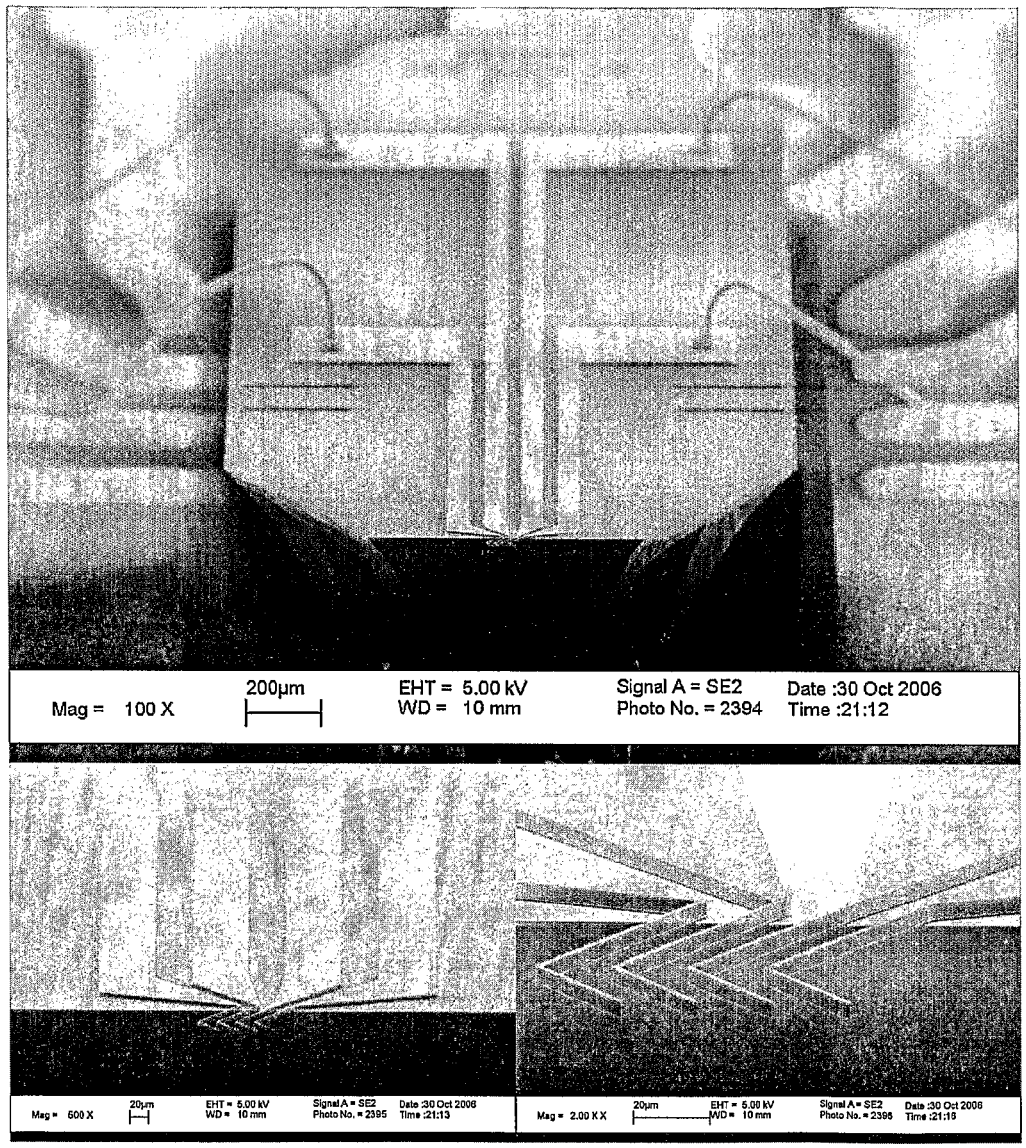
FIGS. 18-20 are SEM micrographs of a micro four point probe with L-shaped cantilevers at different magnification.

FIGS. 18-20 are SEM micrographs of a micro four point probe with L-shaped cantilevers designed with dimensions defined by the graph of FIGS. 16 and 17.

Figure 14:
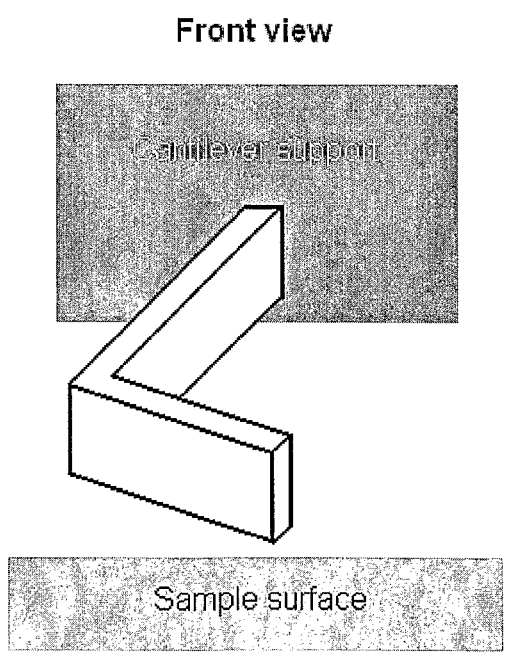
FIG. 14 is a schematic front view of an L-shaped probe before it contacts a surface of a test sample, FIG. 15 a schematic front view of the L-shaped probe of FIG. 14, after it contacts a surface of a test sample.
Figure 15:
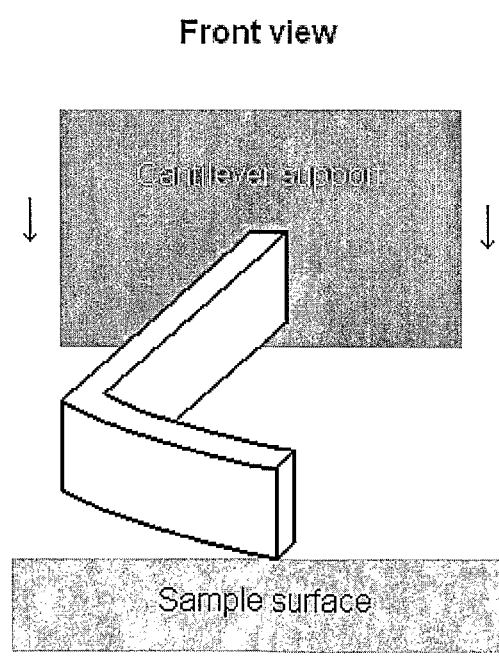

In FIG. 14, the cantilever is presented before, and in FIG. 15 after, contacting a surface part of a test sample. The resulting deflection is only normal to the sample surface (thus a static contact). The rotation in the contact point is negligible for small deflections because of a sub-micrometer sized contact point.

FIG. 14 schematically illustrates a front view of an L-shaped probe before it contacts a surface of a test sample, and FIG. 15 schematically illustrates a front view of the L-shaped probe of FIG. 14, after it contacts a surface of a test sample.

The present invention may be characterised by the following points:

1. A probe for testing electrical properties of test samples comprising:
  a body having a probe arm defining a proximal and an opposite distal end, said probe arm extending from said body at said proximal end of said probe arm, a first axis being defined by said proximal and said distal end,
  said probe arm defining a geometry allowing flexible movement of said probe arm along said first axis and along a second axis perpendicular to said first axis and along a third axis orthogonal to a plane defined by said first axis and second axis.
2. The probe according to point 1, wherein said probe arm is a supporting structure supporting a contact probe for establishing electrical contact to said test sample, a pad for establishing electrical contact to a test apparatus, an electrical conductive strip positioned on or in said body for establishing electrical contact between said contact probe and said pad.
3. The probe according to point 1 or 2, wherein said geometry includes a semi-circular part and/or a square part and/or a rectangular part and/or triangular part and/or any combinations thereof.
4. The probe according to point 1 or 2, wherein said geometry includes two substantially linear parts connected so as to define an angle.
5. The probe according to any of the points 1-4, wherein said probe arm defines substantially equal spring constants in the direction of said first, second and third axis.
6. The probe according to any of the points 1-5, wherein said body includes a plurality of probe arms.
7. The probe according to point 6, wherein said plurality of probe arms define similar geometries or in the alternative at least two different geometries.
8. The probe according to any of the points 1-7, wherein the probe, when in use, defines spring constants that, when projected onto a plane of a surface of said test sample are substantially equal, or define a ratio between 1:1 to 1:20.
9. A test probe for testing electrical properties of test samples comprising:
  a body comprising an electrical conductive contact for establishing electrical contact to said test sample, said body being flexibly suspended by spring means so as to allow said probe to establish static contact with said surface of said test sample.
10. The test probe according to point 9, wherein said probe includes any of the features of the points 1-8.

The invention claimed is:

1. A probe for testing electrical properties of a test sample having a surface facing the probe, said probe comprising:
  a body defining a first planar surface oriented at an angle greater than 0 degrees and less than 90 degrees with respect to the surface of the test sample; and
  a probe arm defining a first part having a proximal end and an opposite distal end, said probe arm extending from said body at said proximal end of said first part, a first axis being defined by said proximal end and said distal end of said first part, said probe arm extending parallel with said first planar surface;
  said probe arm defining a geometry allowing flexible movement of said probe arm along said first axis and along a second axis perpendicular to said first axis and along a third axis orthogonal to a plane defined by said first axis and said second axis;
  wherein the entire length of said probe arm defines a surface that extends distally from said body and that forms a continuous plane with said first planar surface.

2. The probe according to claim 1, wherein said body defines a second planar surface being substantially orthogonal to said first planar surface, said probe arm extending from said second planar surface.

3. The probe according to claim 1, wherein said probe arm defines an L-shaped geometry.

4. A probe for testing electrical properties of a test sample, said probe comprising:
- a body: and
- a cantilever probe arm having a first portion extending along a first axis from a proximal end fixed to the body to a distal end, and a second portion extending from the distal end of the first portion along a second axis perpendicular to the first axis;
- wherein the probe arm is independently flexible along each of the first axis, the second axis, and a third axis orthogonal to a plane defined by the first axis and the second axis; and
- wherein the probe arm, when in static contact with the test sample, defines first, second, and third spring constants in the directions of the first, second and third axes, respectively;
- wherein the probe arm is configured to remain in static contact with the test sample while pressed toward the test sample after achieving contact with the test sample; and
- wherein any two of the first, second, and third spring constants, when projected onto a plane of a surface of the test sample, have a ratio between approximately 1:1 and 1:20.

5. The probe according to claim 4, wherein the ratio between any two of the first, second, and third spring constants, when projected onto a plane of a surface of the test sample, is approximately 1:1.

6. The probe according to claim 4, wherein said probe arm defines a geometry that is selected from a group consisting of semi-circular, square, rectangular, triangular, and any combinations thereof.

7. The probe according to claim 4, wherein said probe arm defines a geometry that includes two substantially linear parts connected so as to define an angle.

8. The probe according to claim 7, wherein said angle is 90 degrees.

9. The probe according to claim 4, wherein said body includes a plurality of probe arms.

10. The probe according to claim 9, wherein the probe arms of said plurality of probe arms define similar geometries.

11. The probe according to claim 9, wherein the probe arms of said plurality of probe arms define at least two different geometries.

12. The probe according to claim 9, wherein said plurality of probe arms each defines an L-shaped geometry.

* * * * *